(12) United States Patent
Lin et al.

(10) Patent No.: US 7,531,900 B2
(45) Date of Patent: May 12, 2009

(54) PACKAGE STRUCTURE FOR ELECTRONIC DEVICE

(75) Inventors: Ji-Cheng Lin, Taipei County (TW); Shyh-Ming Chang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 401 days.

(21) Appl. No.: 11/554,597

(22) Filed: Oct. 31, 2006

(65) Prior Publication Data

US 2007/0210429 A1 Sep. 13, 2007

(30) Foreign Application Priority Data

Mar. 7, 2006 (TW) .............................. 95107544 A

(51) Int. Cl.
*H01L 23/48* (2006.01)

(52) U.S. Cl. ...................................... 257/737; 257/778

(58) Field of Classification Search ................. 257/737, 257/736, 778, 741
See application file for complete search history.

(56) References Cited

U.S. PATENT DOCUMENTS

| 5,393,697 | A | * | 2/1995 | Chang et al. ................. 438/613 |
| 5,431,328 | A | * | 7/1995 | Chang et al. ............ 228/180.22 |
| 5,432,136 | A | * | 7/1995 | Shibata et al. ............... 501/138 |
| 5,477,087 | A | * | 12/1995 | Kawakita et al. ............. 257/737 |
| 6,084,301 | A | | 7/2000 | Chang et al. |
| 6,365,500 | B1 | | 4/2002 | Chang et al. |
| 6,469,374 | B1 | | 10/2002 | Imoto |
| 6,642,136 | B1 | * | 11/2003 | Lee et al. ..................... 438/613 |
| 6,759,270 | B2 | | 7/2004 | Infantolino et al. |
| 6,784,089 | B2 | * | 8/2004 | Lei et al. ..................... 438/613 |
| 6,828,221 | B2 | | 12/2004 | Iijima et al. |
| 2006/0051895 | A1 | | 3/2006 | Abe et al. |

* cited by examiner

*Primary Examiner*—Roy K Potter
(74) *Attorney, Agent, or Firm*—Jianq Chyun IP Office

(57) ABSTRACT

A package structure with embedded electronic devices is provided. The package structure includes a substrate, a multi-layered circuit board, an adhesive film and at least an electronic device. The electronic device is disposed on the substrate. The electronic device is press-adhered to the multi-layered circuit board through the adhesive film and the composite bump thereon, so that the electronic device is embedded within the package structure and between the substrate and the circuit board. Due to the deformity of the composite bump, the electronic device is protected from being cracking in the pressing process.

13 Claims, 7 Drawing Sheets

PACKAGE STRUCTURE FOR ELECTRONIC DEVICE

CROSS-REFERENCE TO RELATED APPLICATION

This application claims the priority benefit of Taiwan application serial no. 95107544, filed Mar. 7, 2006. All disclosure of the Taiwan application is incorporated herein by reference.

BACKGROUND OF THE INVENTION

1. Field of Invention

The present invention relates to a package structure. More particularly, the present invention relates to a package structure with embedded electronic devices.

2. Description of Related Art

The integrated circuit chips (IC chips) are required to offer powerful functions as the electronic products develop toward multi-functions and high speed signal transmission. Moreover, more passive devices are demanded for consumer electronic products. However, under the developing trends of electronic products for miniaturization, lightweight, and low cost, the IC packaging industry is concerned about how to accommodate numerous electronic components or devices in the limited packaging space. In order to meet the above requests, system in package (SIP) packages, including multi-chip module (MCM) packages, are proposed by employing key technologies of the embedded technology and the surface buildup technology. The package structure either can be significantly diminished by embedding electronic devices therein, or may pack up more electronic devices through the embedded technology. The surface buildup technology can increase the circuit density and decrease the device thickness, thus improving the packaging compactness.

However, the yield of the package structure employing the surface buildup technology keeps decreasing as more buildup layers are formed one after another, especially for high pin count chips with additional buildup layers. In order to increase the yield and production and decrease the process complexity, multiple circuit boards are pressed together all at one time, as proposed in U.S. Pat. No. 6,828,221. However, as the pressing process exerts quite large pressure, it is rarely used for directly pressing chips and the substrate together. On the other hand, U.S. Pat. No. 6,759,270 proposed to form a circuit redistribution structure before pressing the multi-layered circuit board and chips together, so as to avoid directly pressing the chips. In addition, in U.S. Pat. No. 6,469,374, the chips are mounted to the board before pressing multiple boards together. Still, considerable issues of broken chips due to overlarge pressing stress exist in these processes.

SUMMARY OF THE INVENTION

The present invention provides a package structure with embedded electronic devices, which employs composite bumps for evenly distributing the pressing stress, thus avoiding cracking of the chip or the electronic device.

The present invention provides a package structure with embedded electronic devices, in which the multi-layered circuit board, the substrate and the electronic devices/chips are pressed together through the adhesive film and composite bumps.

As embodied and broadly described herein, the present invention provides a package structure including a substrate, at least an electronic device disposed on the substrate, at least a composite bump structure, a multi-layered circuit board and an adhesive film disposed between the substrate, the electronic device and the multi-layered circuit board. The electronic device is adhered to the multi-layered circuit board through the adhesive film and the composite bump structure, so that the electrode of the electronic device is electrically connected to the contact of the multi-layered circuit board and the electronic device is embedded between the multi-layered circuit board and the substrate.

According to the embodiment, the composite bump structure includes a polymer body and a metallic coating covering the polymer body. A metal pad layer can be further included between the electrode and the composite bump structure. The composite bump structures can be connected to the contact in a one-to-one fashion or a multiple-to-one fashion.

By using the composite bump structures for spreading out the pressing stress, better co-planarity can be achieved to avoid possible cracking of the chip or the device.

Instead of using the underfill with overflow problems, the package structure with the adhesive film is suitable for even high pin count package structures.

Moreover, with the adhesive film and the composite bump structure, the package structure can be obtained by pressing the circuit board, the substrate and the chip together in one pressing process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings.

The present invention provides a package structure with electronic devices or chips embedded in the package structure. Through the adhesive film and composite bumps, the package structure can be fabricated by pressing multi-layered circuit boards, the substrate and electronic devices/chips together simultaneously or separately.

Figure 1A:
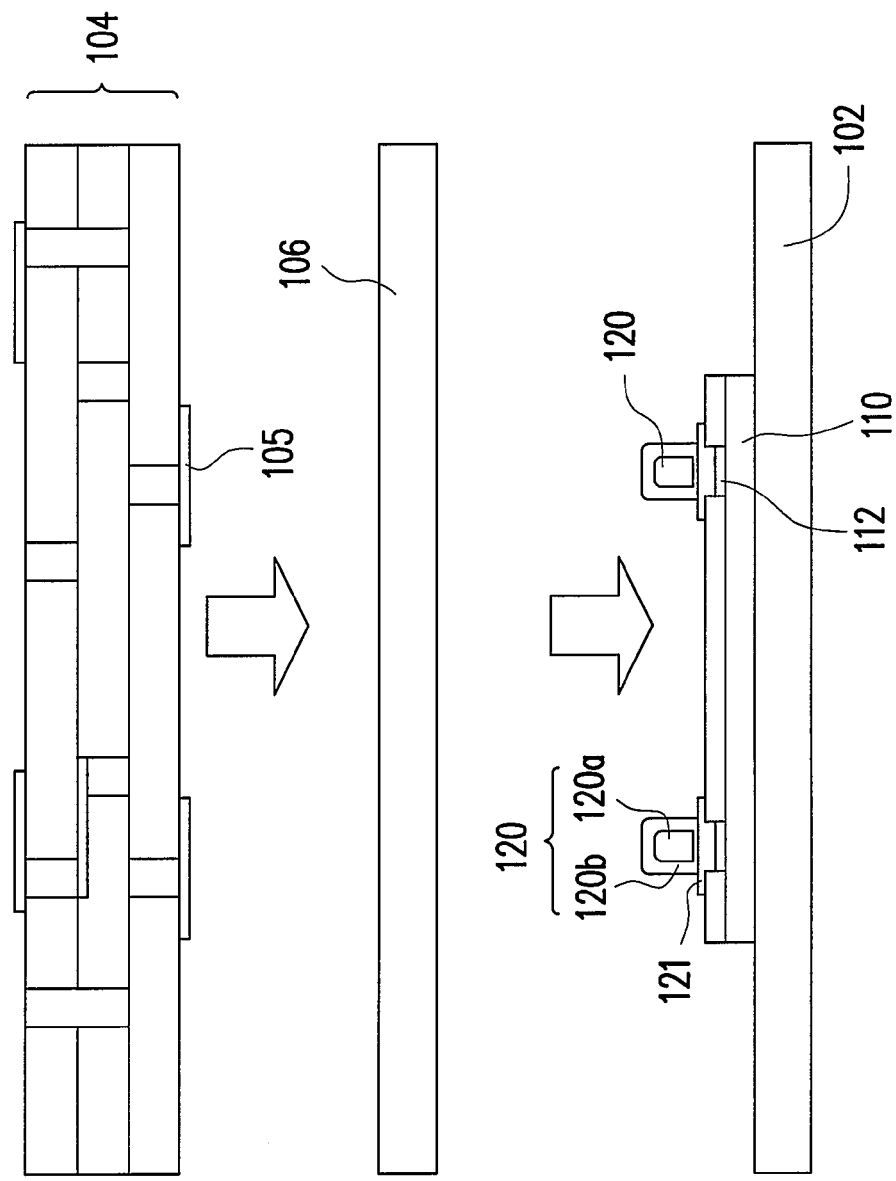
FIG. 1A is a cross-sectional display view of a package structure, before pressing together, according to the first preferred embodiment of the present invention.
Figure 1B:
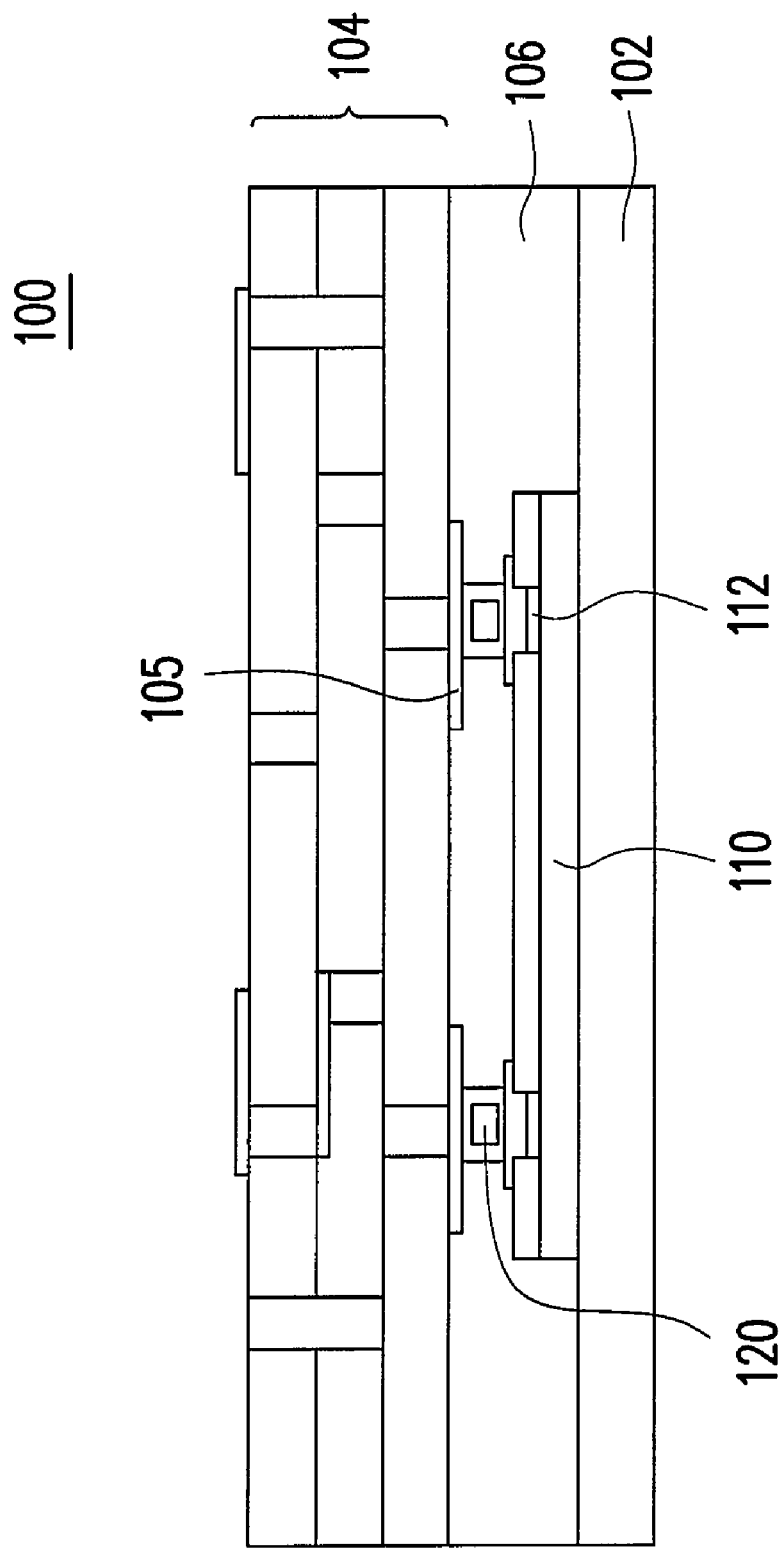
FIG. 1B is a cross-sectional display view of a package structure, after pressing together, according to the first preferred embodiment of the present invention.

FIG. 1A is a cross-sectional display view of a package structure, before pressing together, according to the first preferred embodiment of the present invention. FIG. 1B is the package structure of FIG. 1A, after pressing together.

As shown in FIGS. 1A-1B, the package structure 100 includes a substrate 102, a circuit board 104, an adhesive film 106 and at least an electronic device 110. The electronic device 110 is disposed on the substrate 102. The substrate 102 can be a rigid substrate or a flexible substrate, while the electronic device 110 can be a chip, an active device, or a passive device, for example. The electronic device 110 includes at least an electrode or a pad (electrode/pad) 112, and a conductive bump 120 disposed on the electrode/pad 112. The circuit board 104 can be a multi-layered circuit board having through holes and metal conductive patterns (such as, printed circuit board) or a single layer circuit board, for example. The circuit board 104 includes at least a contact/electrode 105 in a position corresponding to that of the electrode/pad 112 of the electronic device 110.

In FIG. 1B, after pressing together, the electronic device 110 is adhered to the circuit board 104 through the conductive bump 120 on the electrode/pad 112 and the adhesive film 106, so that the electronic device 110 is embedded between the circuit board 104 and the substrate 102.

The adhesive film 106 can be anisotropic conductive film (ACF) or anisotropic conductive paste (ACP), for example. The anisotropic conductive film (ACF) or anisotropic conductive paste (ACP) consists of adhesives and conductive particles, and the adhesives mainly include resin adhesives. During the pressing process, the contact/electrode 105 of the circuit board 104 is electrically connected to the conductive bump 120 on the electrode/pad 112 of the electronic device 110 through the conductive particles in the anisotropic conductive film (ACF) or anisotropic conductive paste (ACP). When ACF or ACP is applied, particle size distribution and uniformity in particle size distribution of the conductive particles may affect the anisotropic conductivity. In general, the particle sizes range from 3-5 microns, since overlarge particles may contact with adjacent particles and result in short-circuits.

As the pitch of the electrodes/pads 112 is small, for example, pitch between the contact pads smaller than 40 microns, the adhesive film 106 can employ non-conductive film (NCF) or non-conductive paste (NCP), for example. During the pressing process, the contact/electrode 105 of the circuit board 104 directly contacts with the conductive bump 120 on the electrode/pad 112 of the electronic device 110 by pressing through the non-conductive film (NCF) or non-conductive paste (NCP).

In this embodiment, the thickness of the adhesive film 106 is about 10-50 microns, for example. If ACF or ACP is used, the thickness of the adhesive film 106 is about 30-50 microns. If NCF or NCP is used, the thickness of the adhesive film 106 is about 20-30 microns.

According to this invention, as shown in FIG. 1A, the conductive bump 120 is a composite bump structure consisting of a metallic coating 120b wrapping around an elastic polymer body 120a, for example. The bump 120 can be formed directly on the electrode/pad 112 of the electronic device 110, or with a metal pad layer 121 between the bump 120 and the electrode/pad 112, depending on the shape of the bump structure and/or the requirements of the fabrication processes. Because the polymer body of the bump 120 is elastic and can be deformed for attenuating the pressing stress and buffering effects, thus avoid cracking of the electronic device or the chip. The details of the shapes, materials, dimensions or possible modifications for such bump structure can be referred to U.S. Pat. No. 6,084,301, and the entire disclosure of U.S. Pat. No. 6,084,301 is incorporated by reference.

Figure 2:
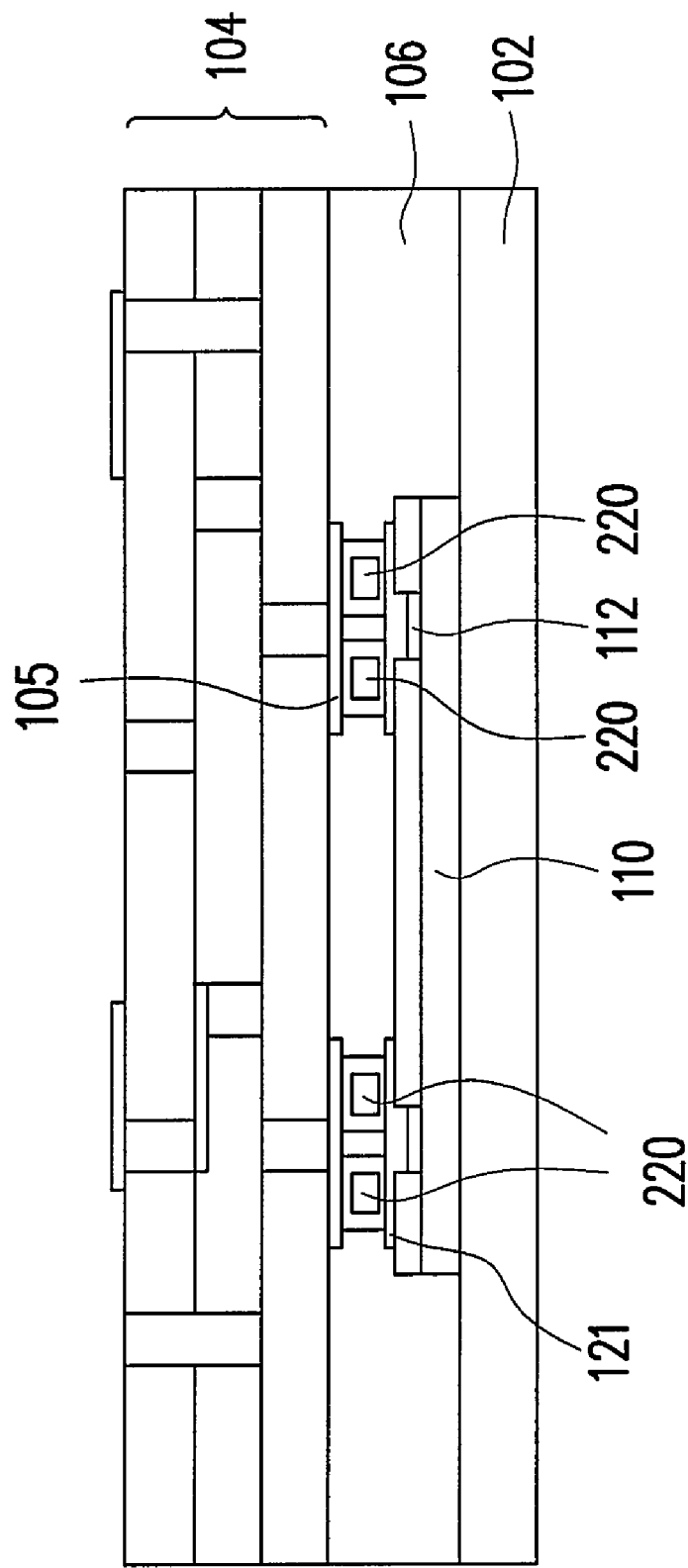
FIG. 2 is a cross-sectional display view of a package structure according to the second preferred embodiment of the present invention.

FIG. 2 is a cross-sectional display view of a package structure according to the second preferred embodiment of the present invention.

As shown in FIG. 2, the package structure is similar to the structure shown in FIG. 1B, and the same reference numbers are used in the drawings and the related descriptions refer to the same or like parts. However, the bumps 220 on the electrode/pad 112 are electrically connected to the contact/electrode 105 of the circuit board 104, in a multiple-to-one fashion, instead of one-to-one fashion in FIG. 1B. The correlative ratios between the bumps 220 and the contact/electrodes 105 can be 2:1 or 4:1, depending on requirements of the layout design.

Figure 3:
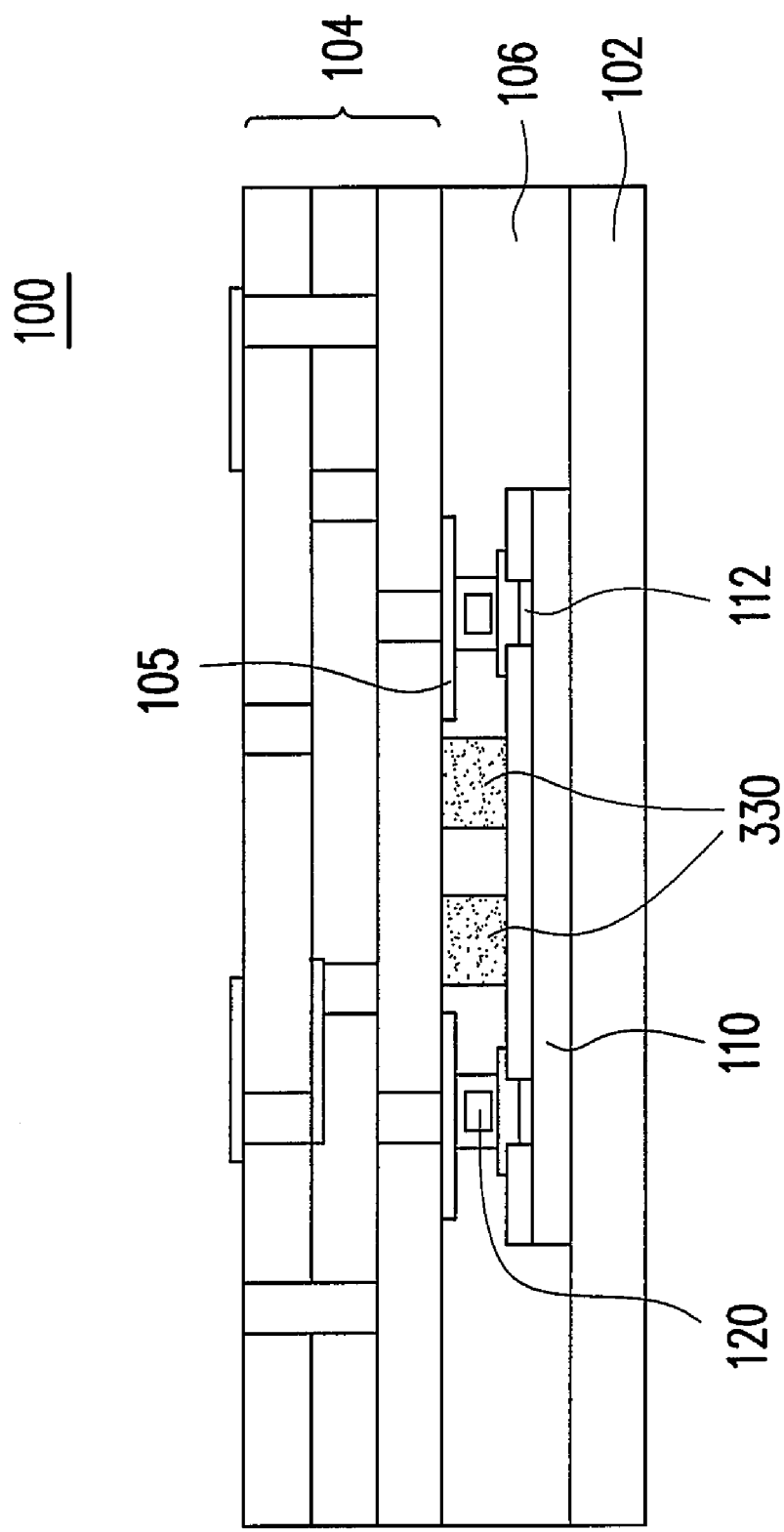
FIG. 3 is a cross-sectional display view of a package structure according to the third preferred embodiment of the present invention.

FIG. 3 is a cross-sectional display view of a package structure according to the third preferred embodiment of the present invention.

As shown in FIG. 3, the package structure is similar to the structure shown in FIG. 1B, and the same reference numbers are used in the drawings and the related descriptions refer to the same or like parts. But the package structure further includes at least a stopper 330 disposed between the bumps 120. The thickness of the stopper 330 is about the same as that of the bump 120 for avoiding over-pressing from breaking or damaging the electronic device or the chip 110. The material of the stopper 330 can be an elastic polymer material, for example. Preferably, if the thickness of the electronic device or the chip is pretty thin, the stopper may be included.

Figure 4:
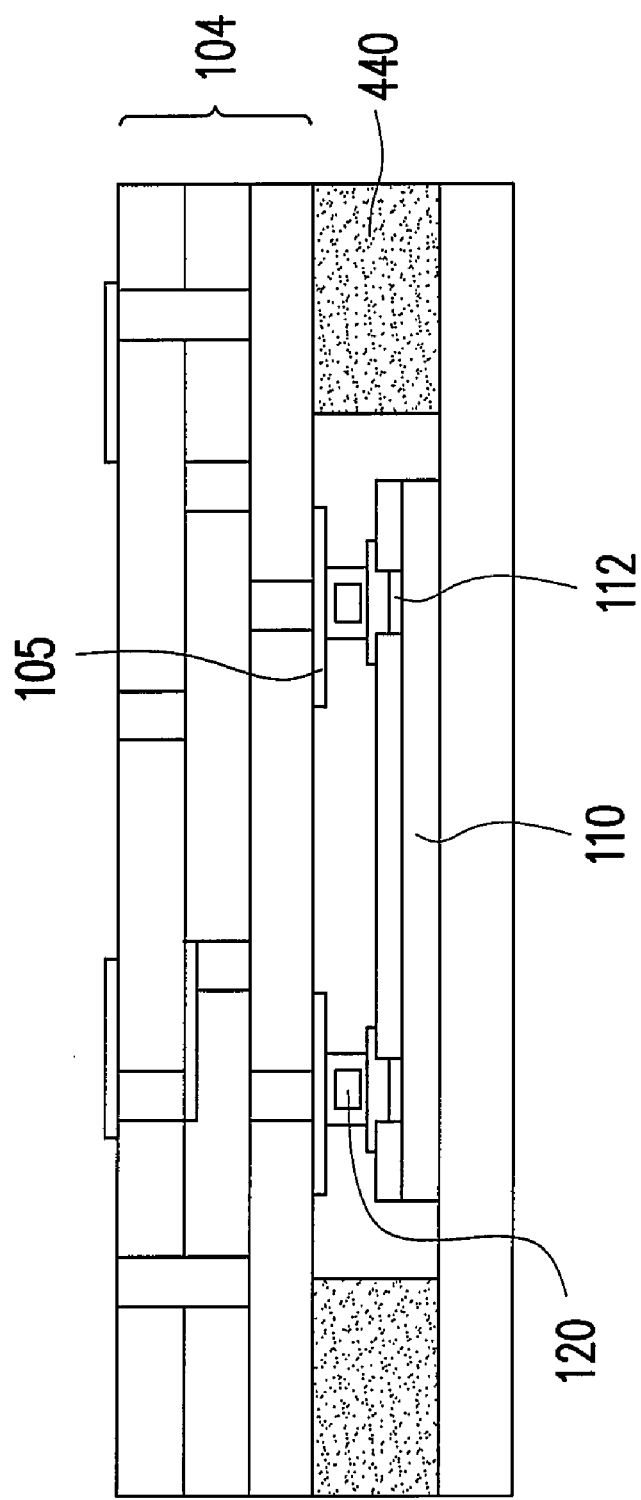
FIG. 4 is a cross-sectional display view of a package structure according to the fourth preferred embodiment of the present invention.

FIG. 4 is a cross-sectional display view of a package structure according to the fourth preferred embodiment of the present invention.

As shown in FIG. 4, the package structure is similar to the structure shown in FIG. 1B, and the same reference numbers are used in the drawings and the related descriptions refer to the same or like parts. But the package structure further includes at least an interposer 440 disposed around or aside of the electronic device 110. The stopper 330 can be used to protect the electronic device or the chip from being breaking or damaging due to over-pressing. Preferably, if the thickness of the electronic device or the chip 110 is pretty thick and the adhesive film may not fill up the space between the substrate 102 and the circuit board 104, the interposer of a predetermined thickness may be included. The material of the interposer 440 can be a metal or an elastic polymer material, for example.

Figure 5:
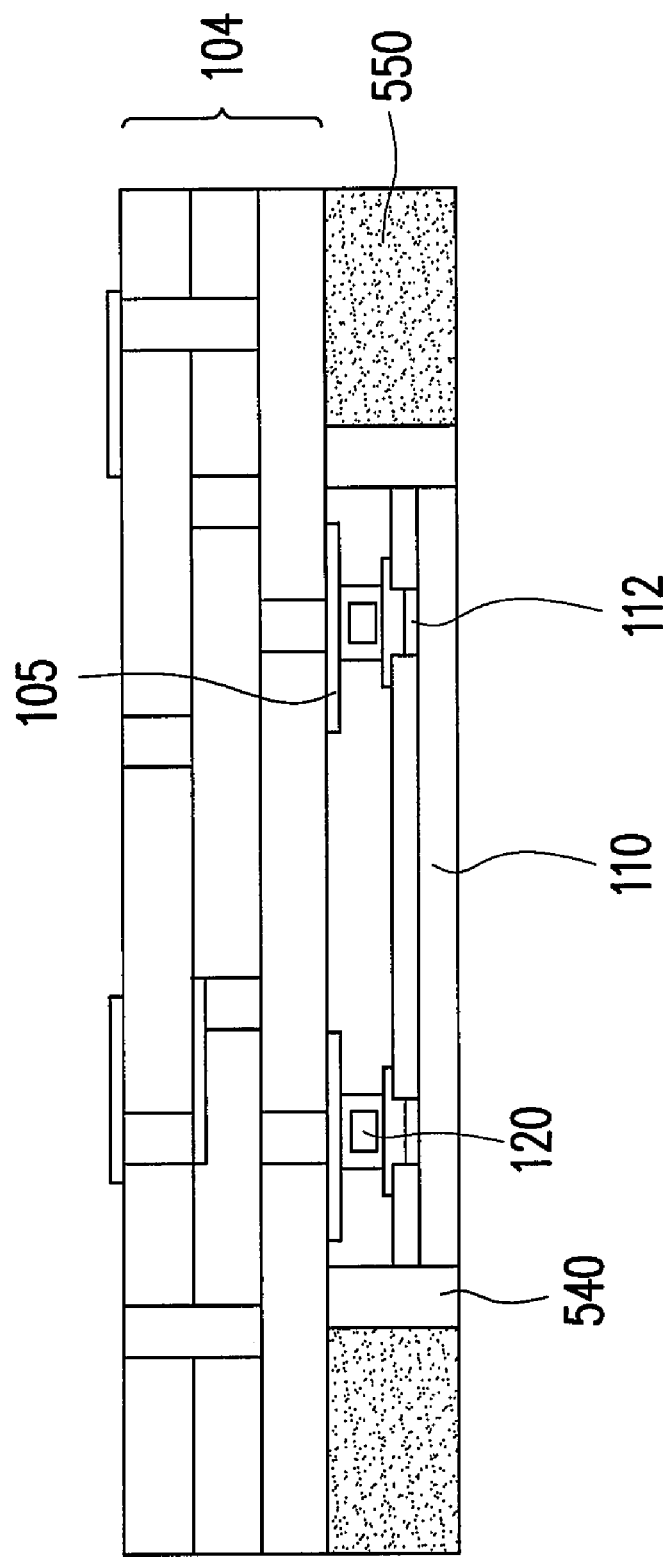
FIG. 5 is a cross-sectional display view of a package structure according to the fifth preferred embodiment of the present invention.

FIG. 5 is a cross-sectional display view of a package structure according to the fifth preferred embodiment of the present invention.

As shown in FIG. 5, the package structure is similar to the structure shown in FIG. 1B, and the same reference numbers are used in the drawings and the related descriptions refer to the same or like parts. But the package structure further includes at least a molding compound 540 to seal the electronic device or the chip 110 and a stiffener 550 beside the electronic device or the chip 110. In general, if the substrate 102 is a flexible substrate, this structure is preferred. The material of the stiffener 550 can be a metallic material, for example.

Figure 6:
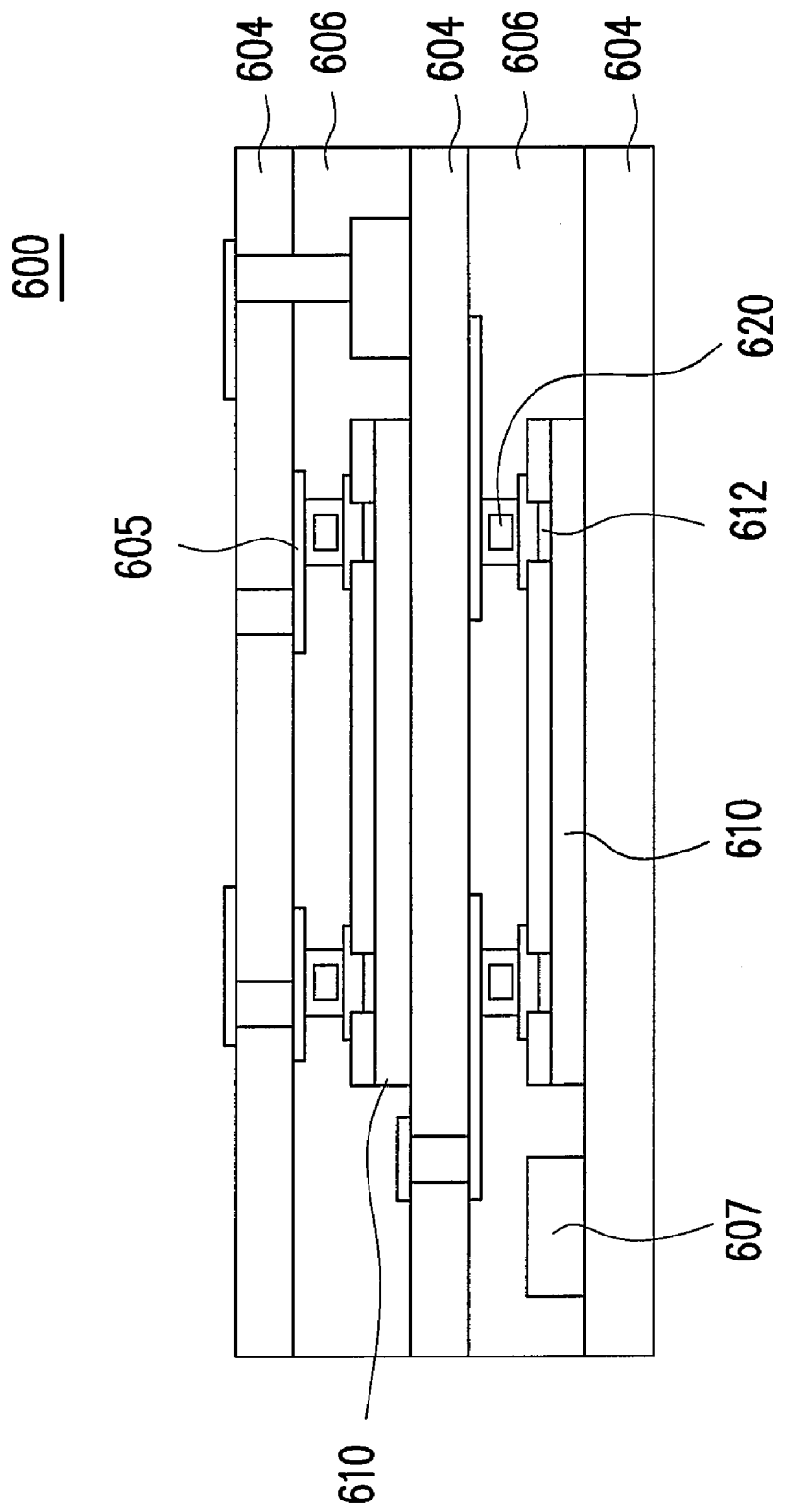
FIG. 6 is a cross-sectional display view of a package structure according to the sixth preferred embodiment of the present invention.

The aforementioned structures can be further applied to multi-chip module packages or can further include a plurality of chips and a plurality of passive devices. FIG. 6 is a cross-sectional display view of a package structure according to the sixth preferred embodiment of the present invention.

As shown in FIG. 6, the package structure 600 includes a plurality of circuit boards 604, adhesive films 606, chips 610 and at least a passive device 607. Each circuit board 604 has at least a chip 610 and/or a passive device 607 disposed thereon. The chip 610 includes at least an electrode 612 and at least a conductive bump 620 on the electrode 612. The circuit board 604 is a single layered circuit board having through holes and conductive patterns, for example. The circuit board 604 has at least a contact/electrode 605 corresponding to the electrode 612 of the chip 610. The package structure in FIG. 6 can be obtained through pressing these boards, films and chips together collectively (i.e. in one pressing process) or in multiple times (i.e. through several pressing processes).

Further according to the design, the package structure may further include a stopper or an interposer for avoiding over-pressing and/or a molding compound and a stiffener. Moreover, the substrate can be a rigid or flexible substrate. The electronic device can be a chip, a passive device or an active device. According to the embodiment, the adhesive film can be anisotropic conductive film (ACF), anisotropic conductive paste (ACP), non-conductive film (NCF) or non-conductive paste (NCP).

In summary, according to the package structure provided in this invention, the electronic device or the chip is embedded in the package structure, thus reducing the size of the package structure. Moreover, as the applied composite bump structure may spread out the pressing stress, the electronic devices or the chips are protected from fracture or damaging, thus improving the yield and the production. Avoid of using the underfill with overflow problems, the package structure employs the adhesive film for joining and the fabrication of the package structure can be simplified with lower costs by using the adhesive film and the composite bump structures.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
    a substrate;
    at least an electronic device disposed on the substrate, wherein the electronic device has at least an electrode;
    at least a composite bump structure disposed on the electrode, wherein the composite bump structure comprises a polymer body and a metallic coating covering the polymer body;
    a multi-layered circuit board, disposed on the composite bump structure and above the electronic device, wherein the multi-layered circuit board has at least a contact in a position corresponding to that of the electrode; and
    an adhesive film disposed between the substrate, the electronic device and the multi-layered circuit board, wherein the electronic device is adhered to the multi-layered circuit board through the adhesive film and the composite bump structure, so that the electrode is electrically connected to the contact and the electronic device is embedded between the multi-layered circuit board and the substrate.

2. The package structure of claim 1, wherein a plurality of composite bump structures is disposed on the electrode to electrically connect the electrode and the contact in a multiple-to-one fashion.

3. The package structure of claim 1, further comprising a stopper disposed on the electronic device and beside the composite bump structure, and between the electronic device and the multi-layered circuit board.

4. The package structure of claim 3, wherein a material of the stopper is a polymer material.

5. The package structure of claim 1, further comprising an interposer disposed on the substrate and beside the electronic device, and between the substrate and the multi-layered circuit board.

6. The package structure of claim 5, wherein a material of the interposer is a polymer material or a metallic material.

7. The package structure of claim 1, wherein the substrate is a rigid substrate.

8. The package structure of claim 1, wherein the substrate is a flexible substrate.

9. The package structure of claim 8, further comprising a molding compound for sealing the electronic device and a stiffener disposed between the multi-layered circuit board and the substrate and beside the electronic device.

10. The package structure of claim 9, wherein a material of the stiffener is a metallic material.

11. The package structure of claim 1, wherein the electronic device is selected from the group consisting of a chip, an active device and a passive device.

12. The package structure of claim 1, further comprising a metal pad layer disposed between the electrode and the composite bump structure.

13. The package structure of claim 1, wherein the adhesive film is selected from the group consisting of anisotropic conductive film (ACF), anisotropic conductive paste (ACP), non-conductive film (NCF) and non-conductive paste (NCP).

* * * * *